United States Patent
Laurent et al.

(10) Patent No.: US 7,247,928 B2
(45) Date of Patent: Jul. 24, 2007

(54) SEMICONDUCTOR DEVICE WITH ELECTRICAL CONNECTION BALLS BETWEEN AN INTEGRATED CIRCUIT CHIP AND A SUPPORT PLATE, AND PROCESS FOR FABRICATING IT

(75) Inventors: Patrick Laurent, Voiron (FR); Xavier Baraton, Moirans (FR)

(73) Assignee: STMicroelectronics SA, Montrouge (FR)

( * ) Notice: Subject to any disclaimer, the term of this patent is extended or adjusted under 35 U.S.C. 154(b) by 33 days.

(21) Appl. No.: 10/867,277

(22) Filed: Jun. 14, 2004

(65) Prior Publication Data
US 2005/0017331 A1    Jan. 27, 2005

(30) Foreign Application Priority Data
Jun. 17, 2003    (FR)    ................................... 03 07251

(51) Int. Cl.
*H01L 23/495* (2006.01)
(52) U.S. Cl. ................. 257/667; 257/789; 257/669; 257/778; 438/108; 438/124; 438/126
(58) Field of Classification Search ........ 257/737–738, 257/666, 678, 723, 787–795, 778, 667, 669, 257/680, 773; 438/123, 106–107, 109–110, 438/121, 112, 124, 126–127
See application file for complete search history.

(56) References Cited
U.S. PATENT DOCUMENTS

| | | | |
|---|---|---|---|
| 5,647,123 A | 7/1997 | Greenwood et al. | |
| 5,763,295 A | 6/1998 | Tokuno et al. | |
| 5,920,116 A * | 7/1999 | Umehara et al. | ............ 257/669 |
| 6,448,633 B1 * | 9/2002 | Yee et al. | .................... 257/666 |
| 6,600,217 B2 * | 7/2003 | Onodera et al. | ............ 257/667 |
| 6,846,701 B2 * | 1/2005 | Patterson | .................... 438/108 |

(Continued)

FOREIGN PATENT DOCUMENTS

JP    04364743    12/1992

(Continued)

OTHER PUBLICATIONS

French Preliminary Search Report dated Jan. 6, 2004 for French Application No. 03 07251.

*Primary Examiner*—Zandra V. Smith
*Assistant Examiner*—Thanh Y. Tran
(74) *Attorney, Agent, or Firm*—Lisa K. Jorgenson; Jose Gutman; Fleit Kain Gibbons Gutman Bongini & Bianco P.L.

(57) ABSTRACT

Semiconductor device (1) and process for fabricating it, the device (1) including an electrical connection support plate (2), an integrated circuit chip placed at a certain location on the support plate (2) and placed at a certain distance from this support plate (2), a plurality of electrical connection balls connecting electrical connection regions (4) of the support plate (2) and corresponding electrical connection pads on the integrated circuit chip, and a fill material at least partly filling the space separating the chip from the plate, and in which the surface of the support plate (2), which has the electrical connection regions (4), is provided with an interlayer (6) made of an insulating material in which apertures (7) are provided above the electrical connection regions (4) and above complementary flow channels (9, 10).

13 Claims, 4 Drawing Sheets

U.S. PATENT DOCUMENTS

| | | | |
|---|---|---|---|
| 6,975,035 B2* | 12/2005 | Lee | 257/778 |
| 7,075,016 B2* | 7/2006 | Lee et al. | 174/250 |
| 2004/0004277 A1* | 1/2004 | Tsai et al. | 257/678 |
| 2004/0061220 A1* | 4/2004 | Miyazaki et al. | 257/723 |

FOREIGN PATENT DOCUMENTS

| | | |
|---|---|---|
| JP | 10144729 | 5/1998 |
| JP | 10233463 | 9/1998 |

* cited by examiner

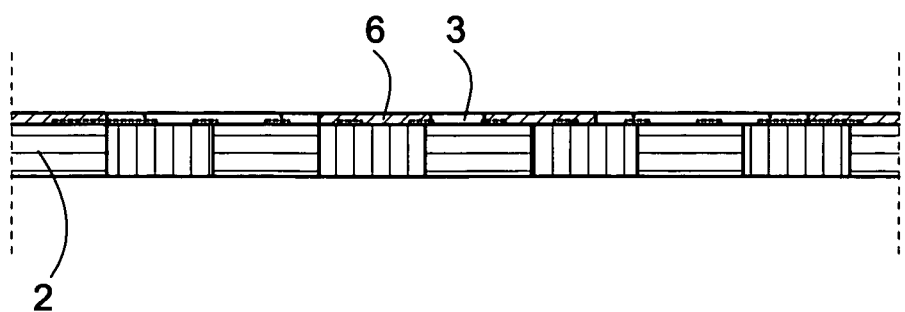
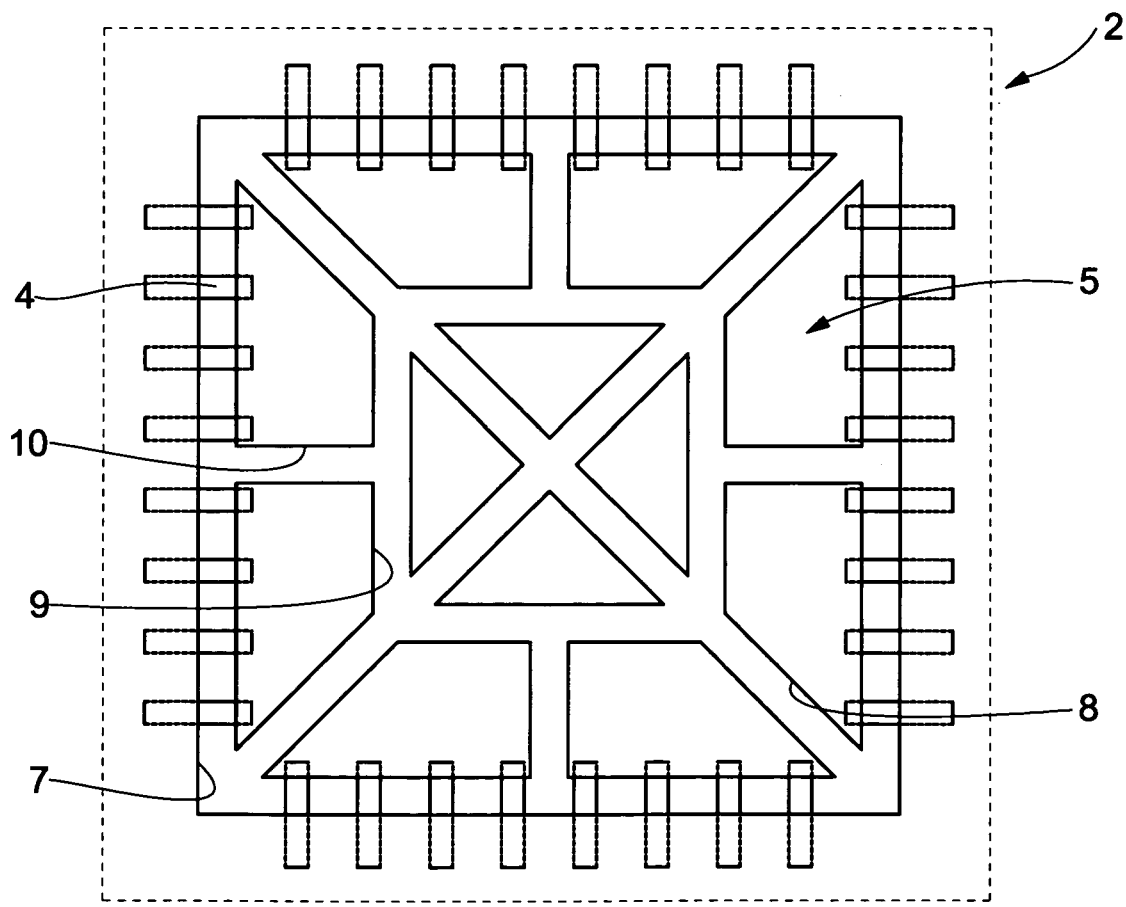

SEMICONDUCTOR DEVICE WITH ELECTRICAL CONNECTION BALLS BETWEEN AN INTEGRATED CIRCUIT CHIP AND A SUPPORT PLATE, AND PROCESS FOR FABRICATING IT

CROSS-REFERENCE TO RELATED APPLICATION

This application is based upon and claims priority from prior French Patent Application No. 03 07251, filed on Jun. 17, 2003, the entire disclosure of which is herein incorporated by reference.

BACKGROUND OF THE INVENTION

1. Field of the Invention

The present invention relates to the field of semiconductor devices containing an integrated circuit chip.

2. Description of the Related Art

Known semiconductor devices comprise an electrical connection support plate having electrical connection regions on a front face, an integrated circuit chip placed at a certain distance from the front face of the support plate and provided with electrical connection pads located so as to face the electrical connection regions of the support plate, electrical connection balls interposed between and soldered to the pads on the chip and the regions of the support plate, and also an electrically non-conducting fill material that fills the space between the support plate and the integrated circuit chip, embedding the electrical connection balls. Furthermore, it is common practice for the front face of the support plate to be provided with a protective interlayer, generally a varnish, in which apertures are provided, at least partly exposing the electrical connection regions.

To fabricate such semiconductor devices, a drop of fill material is deposited on the support plate approximately in the middle of the location that the integrated chip will occupy. Next, the integrated circuit chip provided beforehand with electrical connection balls on these pads is put into place, the movement of the integrated circuit chip approaching the support plate causing the drop of the fill material to spread out. Next, the electrical connection balls are soldered to the regions of the support plate and the fill material is cured.

It has been observed that, as the fill material spreads out, air bubbles or micro bubbles are trapped in this fill material, especially on or near the electrical connection balls and mainly in the local apertures left in the protective interlayer above the electrical connection regions of the support plate.

Such trapped bubbles lower the mechanical strength, weaken the electrical connections between the integrated circuit chip and the support plate via the electrical connection balls and, in general, reduce the quality of the semiconductor devices obtained Accordingly, there exists a need for overcoming the disadvantages of the prior art as discussed above.

SUMMARY OF THE INVENTION

It is an object of the present invention to reduce the abovementioned drawbacks.

The subject of the present invention is firstly a semiconductor device comprising an electrical connection support plate, an integrated circuit chip placed at a certain location on the support plate and placed at a certain distance from this support plate, a plurality of electrical connection balls connecting electrical connection regions of the support plate and corresponding electrical connection pads on the chip, and a fill material at least partly filling the space separating the chip from the plate.

According to the present invention, the surface of the support plate, which has the electrical connection regions, is provided with an interlayer made of an insulating material in which apertures are provided above the electrical connection regions and above the complementary flow channels.

According to the present invention, the interlayer includes flow channels that extend from the central part of the location.

According to the present invention, the interlayer includes flow channels that extend around the central part of the location.

According to the present invention, the interlayer includes flow channels that pass in front of the electrical connection regions.

The subject of the present invention is also a process for fabricating a semiconductor device as defined above.

According to the present invention, this process consists in: providing the surface of the support plate having the electrical connection regions with an interlayer made of an insulating material, providing, in this interlayer, apertures above the electrical connection regions and above the complementary flow channels; depositing at least one drop of the fill material in the liquid state at the location; bringing the chip into place above the support plate, interposing the electrical connection balls in such a way that the drop flows and at least partly fills the space; and soldering the balls and curing the fill material.

According to the present invention, this process preferably consists in providing the chip with the electrical connection balls before it is put into place.

BRIEF DESCRIPTION OF THE DRAWINGS

The present invention will be more clearly understood on examining a semiconductor device described by way of non-limiting example and illustrated by the drawing in which:

FIG. 1 shows a top view of a support plate according to the present invention;

FIG. 2 shows a mid-section of the support plate of FIG. 1;

DETAILED DESCRIPTION

Figure 6:
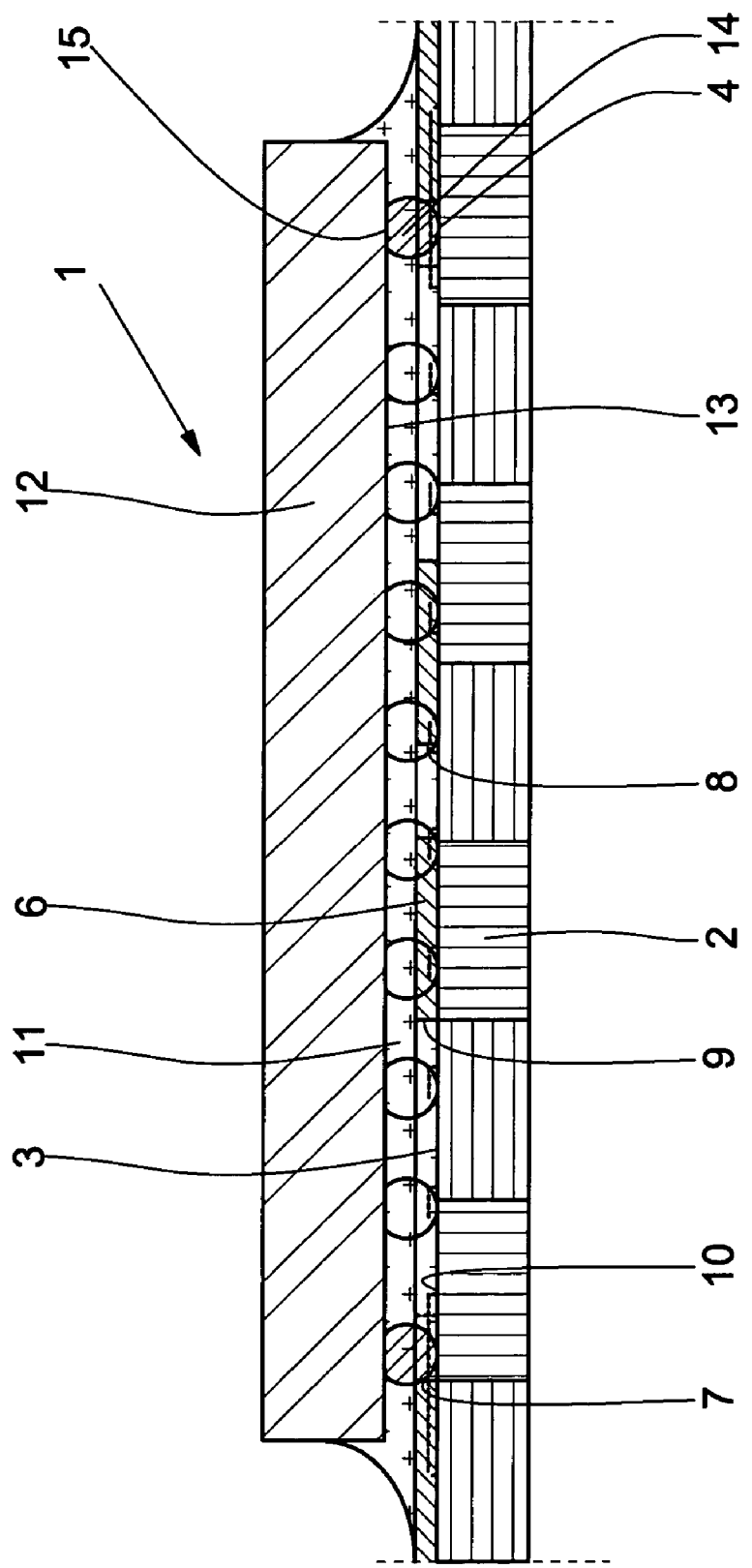
FIG. 6 shows the semiconductor device at the end of the fabrication operation

To fabricate a semiconductor device 1 as shown in FIG. 6, an electrical connection support plate 2 produced in the following manner is used.

FIGS. 1 and 2 essentially show the electrical connection support plate 2 having, on a front surface 3, a plurality of electrical connection regions 4 that are distributed along the sides of an arbitrary square of a location 5 and are connected to an optionally integrated connection network.

The surface 3 of the support plate 2 is provided with an insulating protective interlayer 6, for example made of a varnish, in which various channels are provided, such as those defined below for example, it being possible for these channels to be produced by chemically etching the interlayer 6 through a mask.

The interlayer 6 has four outer channels 7 extending circumferentially and joining up so as to constitute the sides of a square, these channels passing above the electrical connection regions 4 and partly exposing the latter.

The interlayer 6 also has four radial channels 8 forming a cross, the inner ends of which join together at the centre of the location 5 and the outer ends of which join the corners of the square formed by the outer circumferential channels 7.

The interlayer 6 furthermore has four intermediate circumferential channels 9 lying parallel to the channels 7, the ends of which intermediate channels join the radial channels 8 and thus constitute the sides of a square smaller the square formed by the channels 7.

Finally, the interlayer 6 includes radial channels 10 that join the central parts of the outer circumferential channels 7 and of the intermediate circumferential channels 9.

Thus, the channels 7 and 9 lie around the central part of the location 5, the first channels being further away than the second channels, the channels 8 extending from the central part of the location 5.

Figure 4:
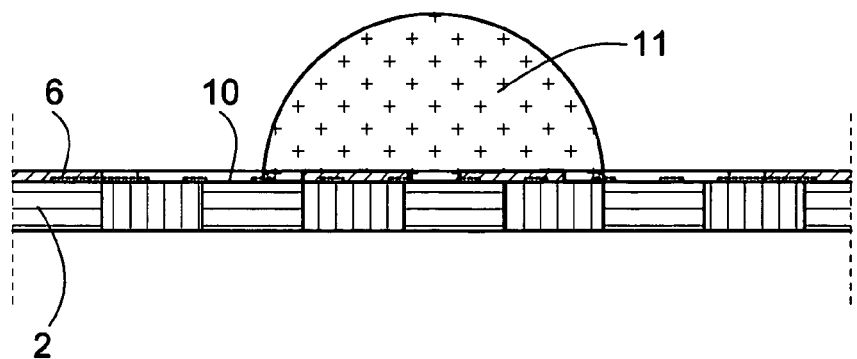
FIG. 4 shows a mid-section of the support plate of FIG. 3.
Figure 3:
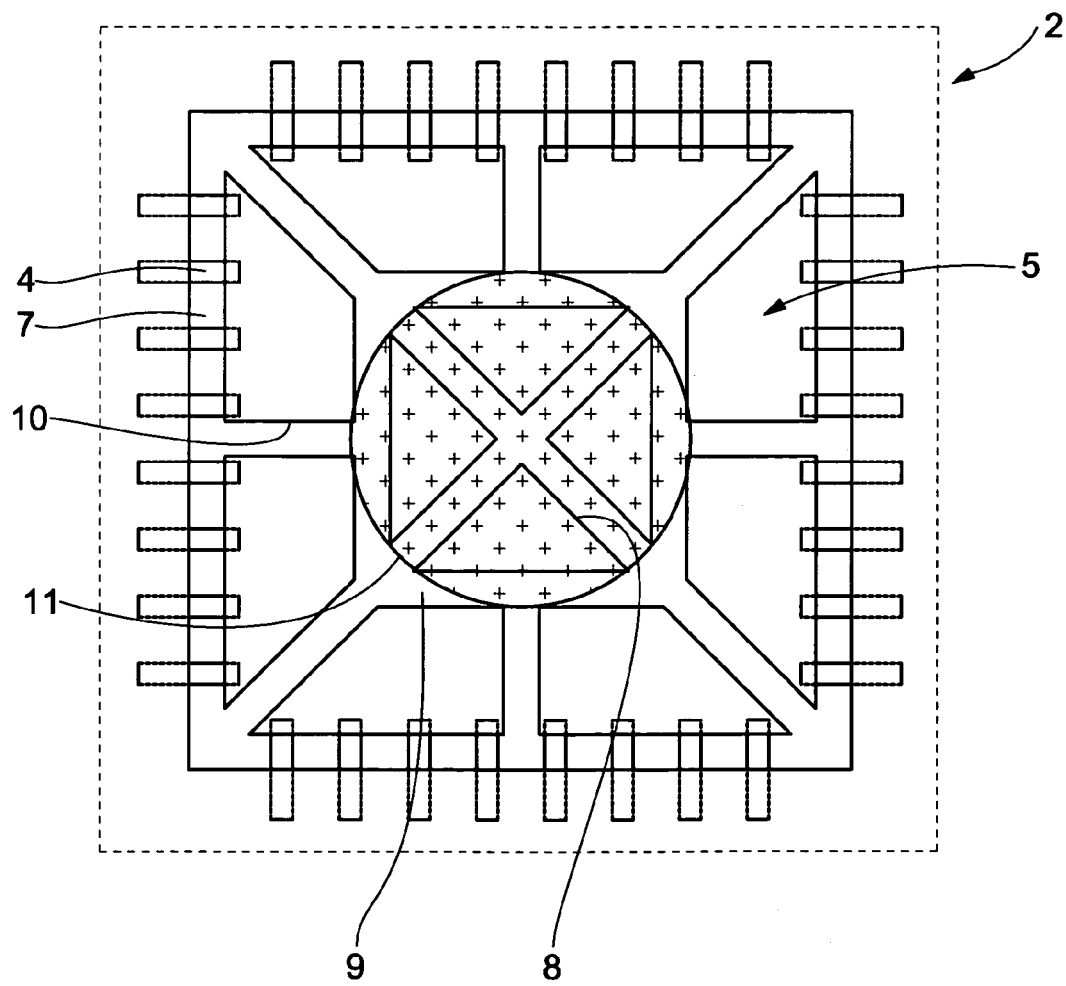
FIG. 3 shows a top view of the aforementioned support plate, after a drop of fill material has been deposited.
Figure 5:
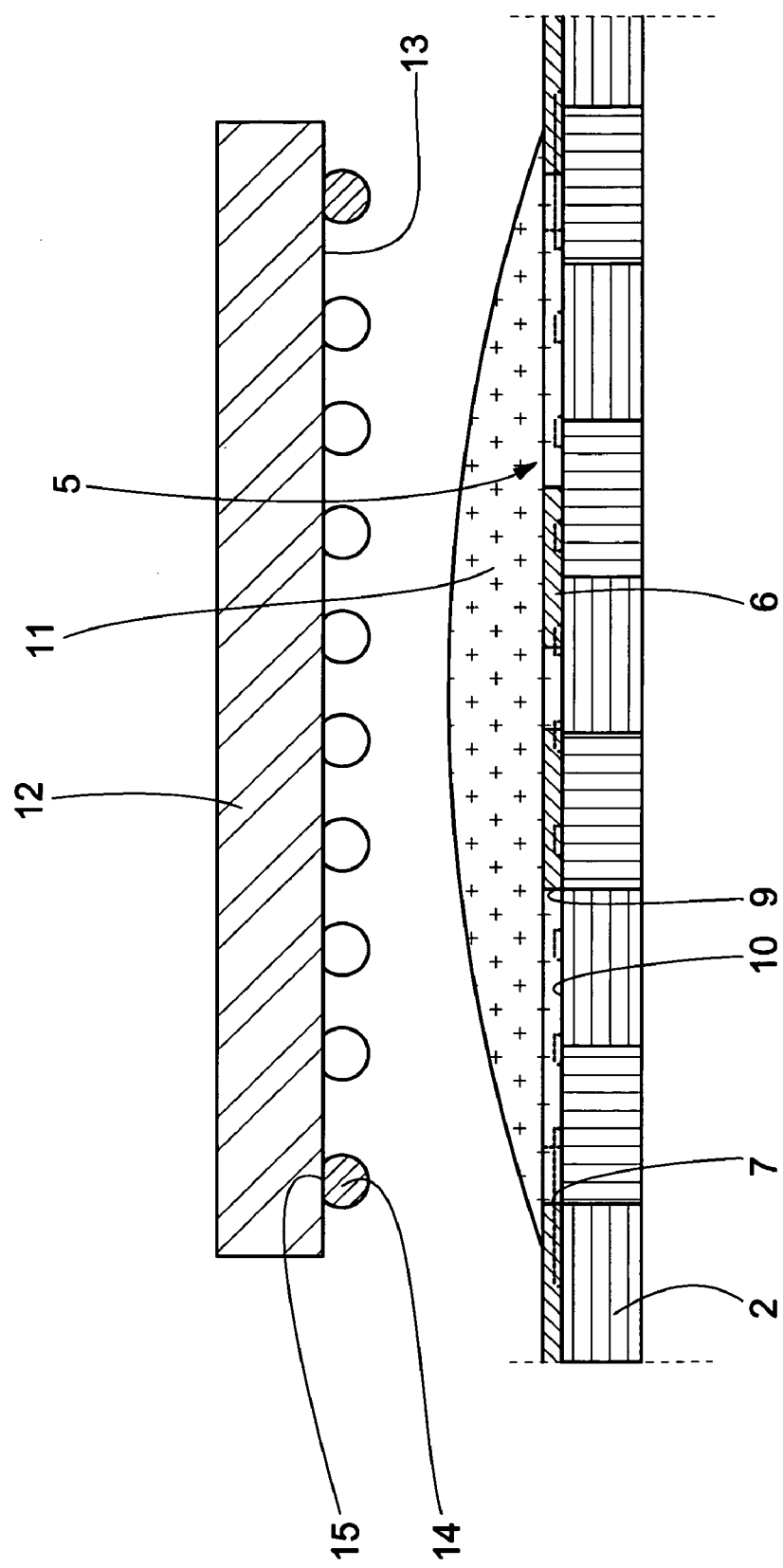
FIG. 5 shows a cross section of a semiconductor device during a fabrication operation.

As shown in FIGS. 3 to 5, the support plate 2 is placed horizontally, the interlayer 6 being uppermost.

A drop 11 of a liquid fill material is deposited in the middle of the location 5 by any known means.

After the initial point of contact, the liquid drop 11 spreads out from the central part of the location 5. During this spreading movement, the channels 7, 8, 9 and 10 at least partly guide at least the lower layer of the drop 11 from the central part of the location 5, and thus constitutes flow channels.

Next, as shown in FIG. 5, an integrated circuit chip 12, provided beforehand on its lower face 13 with metal electrical connection balls 14 soldered to electrical connection pads 15 on this chip, is brought up, above the location 5, using a positioning tool (not shown).

The integrated circuit chip 12 is then placed on the support plate 2 in a position such that it lies parallel to and a certain distance from the support plate 2, and the electrical connection balls 14 come into contact with the respective electrical connection regions 3 of this plate through the channels provided in the protective interlayer 6. Having done this, the drop of fill material 11 continues to spread out, being guided by the flow channels 7, 8, 9 and 10 until the space between the support plate 2 and the integrated circuit chip 12 has been filled.

After this, the electrical connection balls 14 are soldered to the electrical connection regions 4 of the support plate 2 and the fill material 11 is cured. The semiconductor device 1 shown in FIG. 6 is therefore obtained.

The flow channels 7, 8, 9 and 10 help to guide the fill material 11 and distribute it within the space separating the support plate 2 from the integrated circuit chip 12. To be specific, the channels 8 and 10 guide the fill material 11 radially from the central part of the location 5 and the circumferential channels 7 and 10, which lie around the central part of the location 5, guide the fill material 11 circumferentially around the location 5.

Furthermore, the flow channels 7, 8, 9 and 10 prevent, or at the very least limit, the trapping of air bubbles or micro bubbles in the fill material 11, especially in the sensitive region of the interfaces between the electrical connection regions 4 of the support plate 2 and the electrical connection balls 14.

By way of example, the interlayer 6 may have a thickness approximately equal to 30 microns; the thickness of the space separating the support plate 2 from the chip 12, that is to say the space between the interlayer 6 and the chip 12, may be approximately equal to 40 microns; and the width of the channels 7, 8, 9 and 10 may be between 50 and 300 microns.

The present invention is not limited to the example described above. In particular, the flow channels provided in the interlayer 6 could have other arrangements, thus making it possible to guide the flow outwards and/or peripherally.

While there has been illustrated and described what is presently considered to be a preferred embodiment of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiment disclosed, but that the invention include all embodiments falling within the scope of the appended claims.

The invention claimed is:

1. A semiconductor device comprising:
   an electrical connection support plate;
   an integrated circuit chip placed at a certain location on the support plate and placed at a certain distance from this support plate;
   a plurality of electrical connection balls connecting electrical connection regions of the support plate and corresponding electrical connection pads on the chip;
   an interlayer made of an insulating material disposed on a surface of the support plate and between the chip and the support plate, wherein apertures are provided in the interlayer directly above the electrical connection regions, and wherein complementary flow channels that include the apertures are provided in the interlayer to permit, when the chip is placed on the certain location on the support plate, liquid fill material in channels at a central part of the certain location to flow substantially parallel to the surface of the chip through the channels and over the support plate to fill empty space between the chip and the surface of the support plate, wherein the complementary flow channels in the interlayer include
   at least one peripheral flow channel that passes directly above a plurality of the electrical connection regions and connects to a plurality of apertures respectively directly above the plurality of the electrical connection regions, and
   radial flow channels that extend outwardly from a central part of the certain location and are connected to the at least one peripheral flow channel; and
   a fill material at least partly filling the space separating the chip from the support plate.

2. The semiconductor device according to claim 1, wherein the complementary flow channels in the interlayer include flow channels that extend around the central part of the certain location in a circumferential pattern and that are connected to the radial flow channels.

3. The semiconductor device according to claim 2, wherein the complementary flow channels in the interlayer include at least one peripheral flow channel that extends around the central part of the certain location in a circumferential pattern and that passes directly above the electrical connection regions.

4. The semiconductor device according to claim 1, wherein the interlayer includes flow channels that extend outwardly from the central part of the certain location and are connected to flow channels that extend around the central part of the certain location in an intermediate circumferential pattern that is closer to the central part than the at least one peripheral flow channel.

5. The semiconductor device according to claim 4, wherein the interlayer includes flow channels that extend around the central part of the certain location in a first outer circumferential pattern that passes directly above the electrical connection regions and connects to the apertures directly above the electrical connection regions, and in a second intermediate circumferential pattern that is closer to the central part than the first outer circumferential pattern.

6. A process for fabricating a semiconductor device comprising a support plate, an integrated circuit chip placed at a certain location on the support plate and placed at a certain distance from this support plate, a plurality of electrical connection balls connecting electrical connection regions of the support plate and corresponding electrical connection pads on the chip, and a fill material at least partly filling the space separating the chip from the plate, the method comprising:
 providing the surface of the support plate having the electrical connection regions with an interlayer made of an insulating material;
 providing, in this interlayer, apertures directly above the electrical connection regions and complementary flow channels including at least one peripheral flow channel that passes directly above the connection regions and connects to the apertures, and radial flow channels that extend outwardly from a central part of the certain location and are connected to the at least one peripheral flow channel;
 depositing at least one drop of the fill material in liquid state at the central part of the certain location;
 bringing the chip into place above the support plate at the certain location and lowering the chip in such a way that the drop flows from the central part of the certain location in the complementary flow channels and over the support plate and at least partly fills the empty space between the chip and the surface of the support plate; and
 soldering the balls and curing the fill material.

7. The process according to claim 6, further comprising:
 providing the chip with the electrical connection balls before it is put into place.

8. An electronic device comprising:
 a plurality of semiconductor devices, at least one of the plurality of the semiconductor devices comprising:
 an electrical connection support plate;
 an integrated circuit chip placed at a certain location on the support plate and placed at a certain distance from this support plate;
 a plurality of electrical connection balls connecting electrical connection regions of the support plate and corresponding electrical connection pads on the chip;
 an interlayer made of an insulating material disposed on a surface of the support plate and between the chip and the support plate, wherein apertures are provided in the interlayer directly above the electrical connection regions, and wherein complementary flow channels that include the apertures are provided in the interlayer to permit, when the chip is placed on the certain location on the support plate, liquid fill material in channels at a central part of the certain location to flow substantially parallel to the surface of the chip through the channels and over the support plate to fill empty space between the chip and the surface of the support plate, wherein the complementary flow channels in the interlayer include
 at least one peripheral flow channel that passes directly above a plurality of the electrical connection regions and connects to a plurality of apertures respectively directly above the plurality of the electrical connection regions, and
 radial flow channels that extend outwardly from a central part of the certain location and are connected to the at least one peripheral flow channel; and
 a fill material at least partly filling the space separating the chip from the support plate.

9. The electronic device of claim 8, wherein the interlayer includes flow channels that extend around the central part of the certain location in a first outer circumferential pattern that passes directly above the electrical connection regions and connects to the apertures directly above the electrical connection regions, and in a second intermediate circumferential pattern that is closer to the central part than the first outer circumferential pattern.

10. The electronic device of claim 8, wherein the complementary flow channels in the interlaver include at least one peripheral flow channel that extends around the central part of the certain location in a circumferential pattern and that passes directly above the electrical connection regions.

11. The electronic device of claim 8, wherein the interlayer includes flow channels that extend outwardly from the central part of the certain location and are connected to flow channels that extend around the central part of the certain location in an intermediate circumferential pattern that is closer to the central part than the at least one peripheral flow channel.

12. The semiconductor device of claim 11, wherein the complementary flow channels in the interlayer include flow channels that extend around the central part of the certain location in a circumferential pattern and that are connected to the radial flow channels.

13. The semiconductor device of claim 11, wherein the complementary flow channels in the interlayer include at least one peripheral flow channel that extends around the central part of the certain location in a circumferential pattern and that passes directly above the electrical connection regions.

* * * * *